(12) United States Patent  (10) Patent No.: US 7,935,934 B2
Komatsubara  (45) Date of Patent: May 3, 2011

(54) PHOTOSENSOR AND PHOTO IC EQUIPPED WITH SAME

(75) Inventor: Hirotaka Komatsubara, Miyagi (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 300 days.

(21) Appl. No.: 12/344,400

(22) Filed: Dec. 26, 2008

(65) Prior Publication Data
US 2009/0179156 A1 Jul. 16, 2009

(30) Foreign Application Priority Data
Jan. 15, 2008 (JP) .................... 2008-006311

(51) Int. Cl.
G01J 1/42 (2006.01)
(52) U.S. Cl. ........................................ 250/372
(58) Field of Classification Search ............ 250/372
See application file for complete search history.

(56) References Cited

U.S. PATENT DOCUMENTS

| 7,196,790 | B2 * | 3/2007 | Cole ................ 356/326 |
| 2007/0241279 | A1 * | 10/2007 | Starikov et al. ........ 250/338.4 |
| 2008/0237763 | A1 * | 10/2008 | Miura et al. ............ 257/432 |
| 2008/0296642 | A1 * | 12/2008 | Miura ................... 257/292 |
| 2009/0179241 | A1 * | 7/2009 | Kawai .................. 257/292 |
| 2009/0243019 | A1 * | 10/2009 | Kawai .................. 257/440 |
| 2010/0032569 | A1 * | 2/2010 | Kita ................... 250/338.4 |

FOREIGN PATENT DOCUMENTS

| JP | 07-162024 | 6/1995 |
| JP | 2004-006694 | 1/2004 |

* cited by examiner

*Primary Examiner* — David P Porta
*Assistant Examiner* — David S Baker
(74) *Attorney, Agent, or Firm* — Rabin & Berdo, P.C.

(57) ABSTRACT

The photosensor comprises an insulating layer formed over the silicon substrate; an ultraviolet photosensitive element formed over the insulating layer and having a first diffusion layer, a second diffusion layer provided spaced away from the first diffusion layer, and a third diffusion layer connected with the first diffusion layer and the second diffusion layer respectively; and a visible light photosensitive element formed over the insulating layer with being spaced away from the ultraviolet photosensitive element, and having a fourth diffusion layer, a fifth diffusion layer provided spaced away from the fourth diffusion layer, and a sixth diffusion layer connected with the fourth diffusion layer and the fifth diffusion layer respectively.

8 Claims, 7 Drawing Sheets

PHOTOSENSOR AND PHOTO IC EQUIPPED WITH SAME

BACKGROUND OF THE INVENTION

The present invention relates to a photosensor which detects light in an ultraviolet region and light in a visible light region respectively, and a photo IC equipped with the same.

A conventional ultraviolet sensor is provided wherein an "E"-shaped N-type high concentration diffusion layer with an N-type impurity diffused therein in a high concentration and a "π"-shaped P-type high concentration diffusion layer with a P-type impurity diffused therein in a high concentration are disposed, in a silicon semiconductor layer of a semiconductor substrate having an SOI (Silicon On Insulator) structure in which a silicon semiconductor layer having a thickness of 150 nm or so is formed on a silicon substrate with an embedded oxide film interposed therebetween, opposite to each other in engagement with each other with a silicon semiconductor layer with an N-type impurity diffused therein in a low concentration being interposed therebetween, and a depletion layer is formed in a lateral direction to form a lateral ultraviolet photosensitive element photosensitive only to light in an ultraviolet region, whereby the intensity of the light in the ultraviolet region is detected (refer to, for example, a patent document 1 (Japanese Patent Publication Laid Open Number Hei 7 (1995)-162024)).

As to a conventional visible light sensor, an N-type region is formed in a surface layer of a P-type silicon substrate and a P-type region is formed in a surface layer of the N-type region, a first visible light photosensitive element having peak sensitivity in a visible light region is formed by the N-type region and the P-type region, and a second visible light photosensitive element having peak sensitivity in an infrared region is formed by the P-type silicon substrate and an N-type region, thereby forming a vertical visible light sensor. Outputs produced from the first and second visible light photosensitive elements respectively are amplified and subjected to arithmetic processing thereby to detect the intensity of light in the visible light region (refer to, for example, a patent document 2 (Japanese Patent Publication Laid Open Number 2004-6694)).

However, each of the techniques of the patent documents 1 and 2 is accompanied by problems that since the ultraviolet sensor equipped with the ultraviolet photosensitive element and the visible light sensor equipped with the two visible light photosensitive elements are respectively formed singly, there is a need to mount separately-provided ultraviolet and visible light sensors to a wiring board or the like formed with a peripheral circuit thereby to form a photosensor for the purpose of forming a photosensor equipped with a function for detecting light in the ultraviolet region and a function for detecting light in the visible light region, thereby increasing the manufacturing cost and causing a need to ensure space for providing the wiring board at an apparatus equipped with the photosensor, thus encountering difficulties in miniaturizing an apparatus equipped with the photosensor including the function of detecting light in the ultraviolet region and the function of detecting light in the visible light region.

SUMMARY OF THE INVENTION

The present invention has been made to solve the foregoing problems. It is therefore an object of the present invention to provide a small-sized photosensor in which an ultraviolet photosensitive element and a visible light photosensitive element are formed over the same semiconductor substrate to attain a single chip.

According to one aspect of the present invention, for attaining the above object, there is provided a photosensor comprising a silicon substrate; an insulating layer formed over the silicon substrate; an ultraviolet photosensitive element formed over the insulating layer and having a first diffusion layer having a first conductivity type, a second diffusion layer provided spaced away from the first diffusion layer and having a second conductivity type opposite to the first conductivity type, and a third diffusion layer connected with the first diffusion layer and the second diffusion layer respectively and having the first conductivity type; and a visible light photosensitive element which is formed over the insulating layer with being spaced away from the ultraviolet photosensitive element and has a fourth diffusion layer having a third conductivity type, a fifth diffusion layer provided spaced away from the fourth diffusion layer and having a fourth conductivity type opposite to the third conductivity type, and a sixth diffusion layer connected with the fourth diffusion layer and the fifth diffusion layer respectively and having the third conductivity type, wherein the thickness of the third diffusion layer of the ultraviolet photosensitive element is smaller than that of the sixth diffusion layer of the visible light photosensitive element.

Thus, the present invention brings about advantageous effects in that a photosensor in which an ultraviolet photosensitive element and a visible light photosensitive element are formed in a silicon semiconductor layer of the same semiconductor substrate to have a function for detecting ultraviolet light and a function for detecting visible light can be one-chipped to attain a reduction in size, thereby making it possible to facilitate miniaturization of an apparatus to which the photosensor is mounted.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of a photosensor according to the present invention and a photo IC equipped therewith will hereinafter be described with reference to the accompanying drawings.

Figure 1:
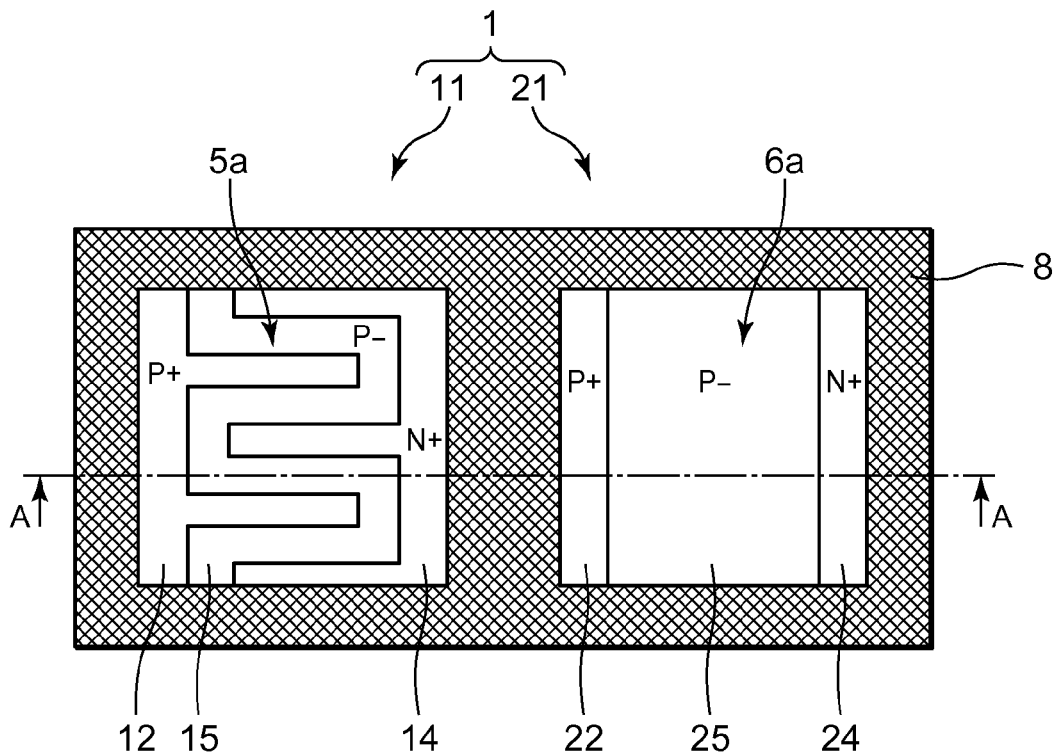
FIG. 1 is an explanatory diagram showing an upper surface of a photosensor according to an embodiment.
Figure 2:
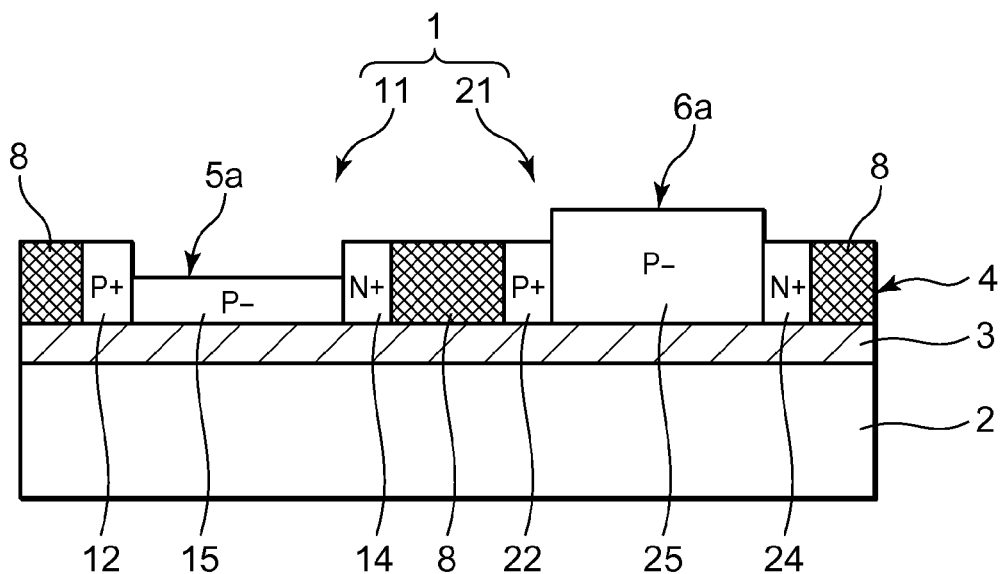
FIG. 2 is an explanatory diagram illustrating a section of the photosensor according to the embodiment.
Figure 3A:
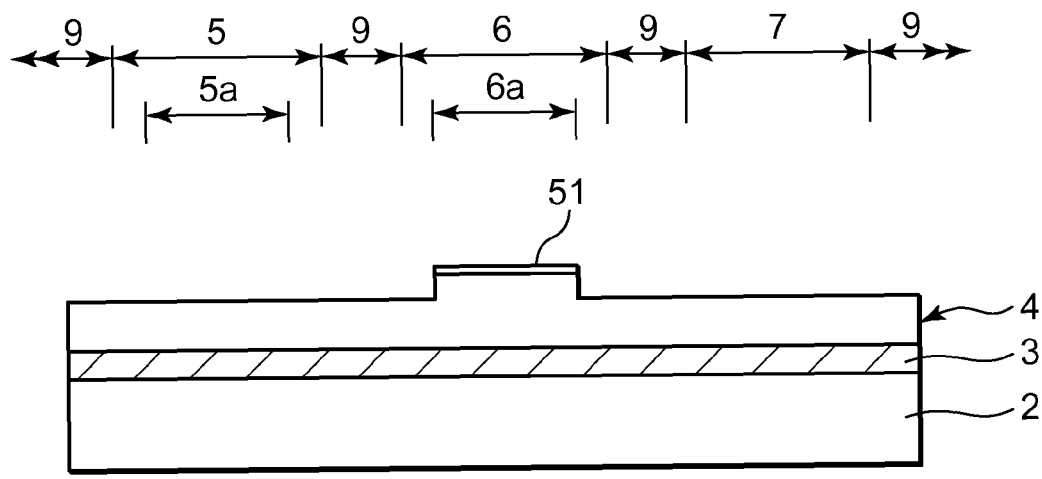
FIG. 3 is an explanatory diagram depicting a method for manufacturing a photo IC equipped with the photosensor according to the embodiment.
Figure 3B:
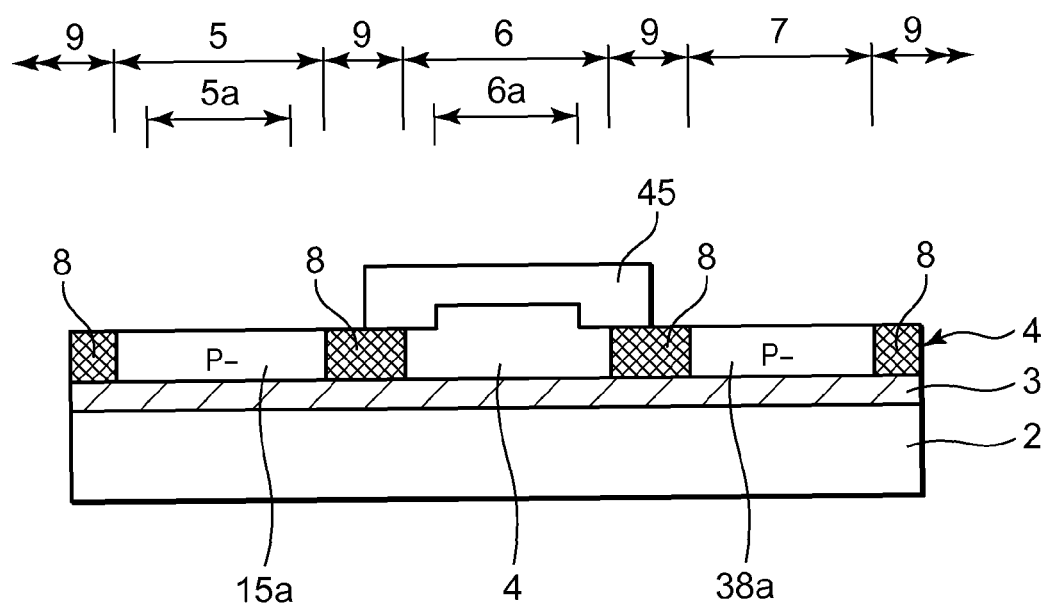
Figure 3C:
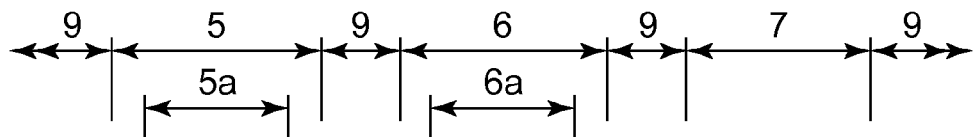
Figure 3C:
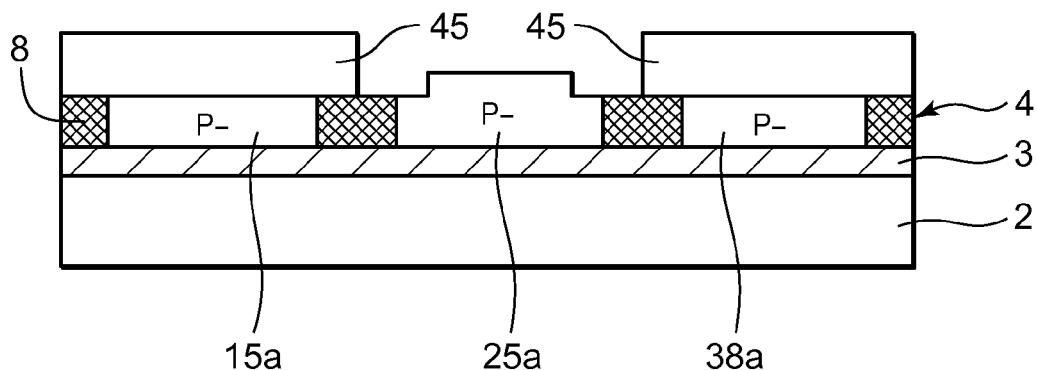
Figure 3D:
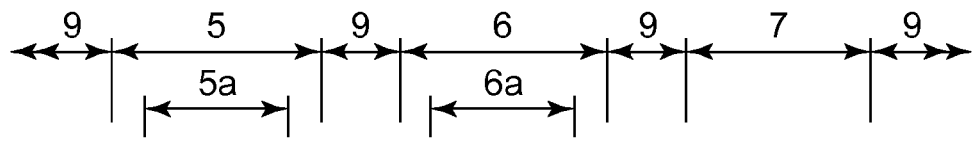
Figure 3D:
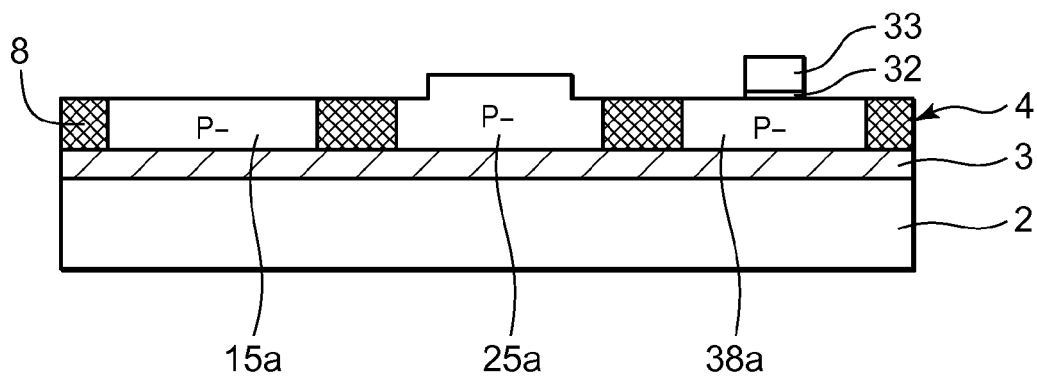
Figure 3E:
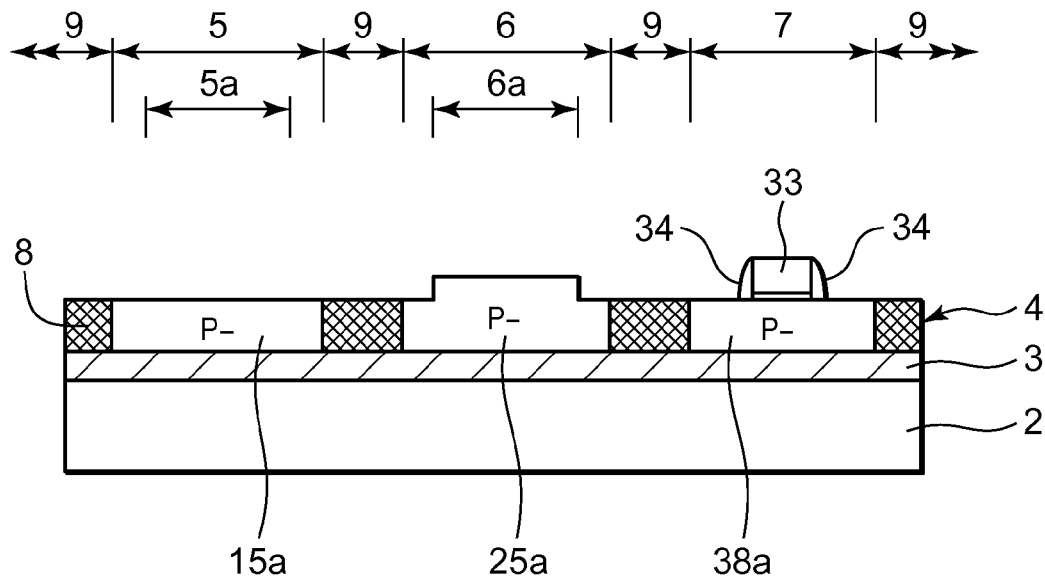
Figure 3F:
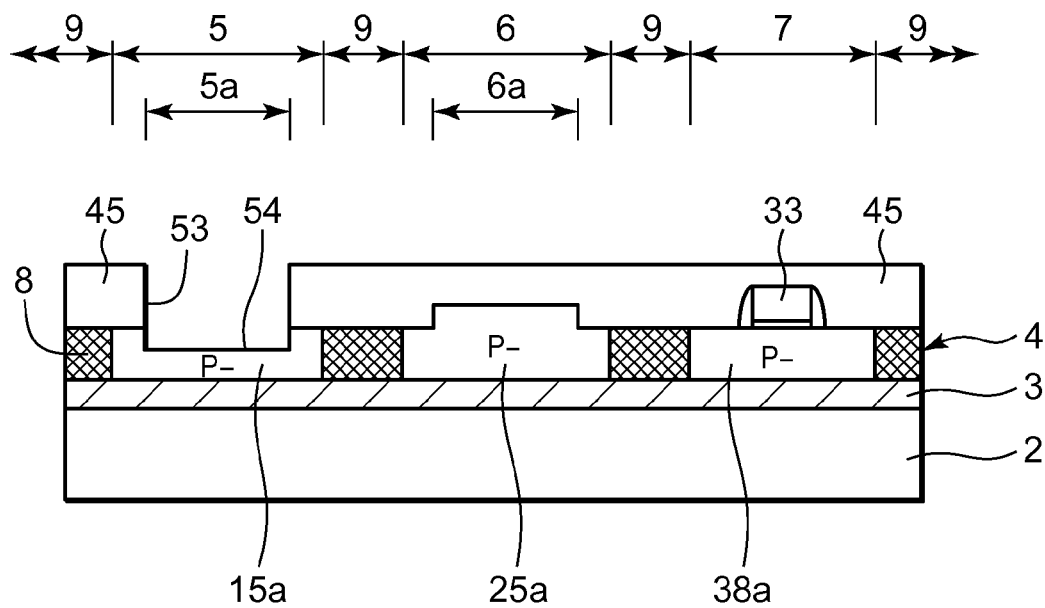
Figure 3G:
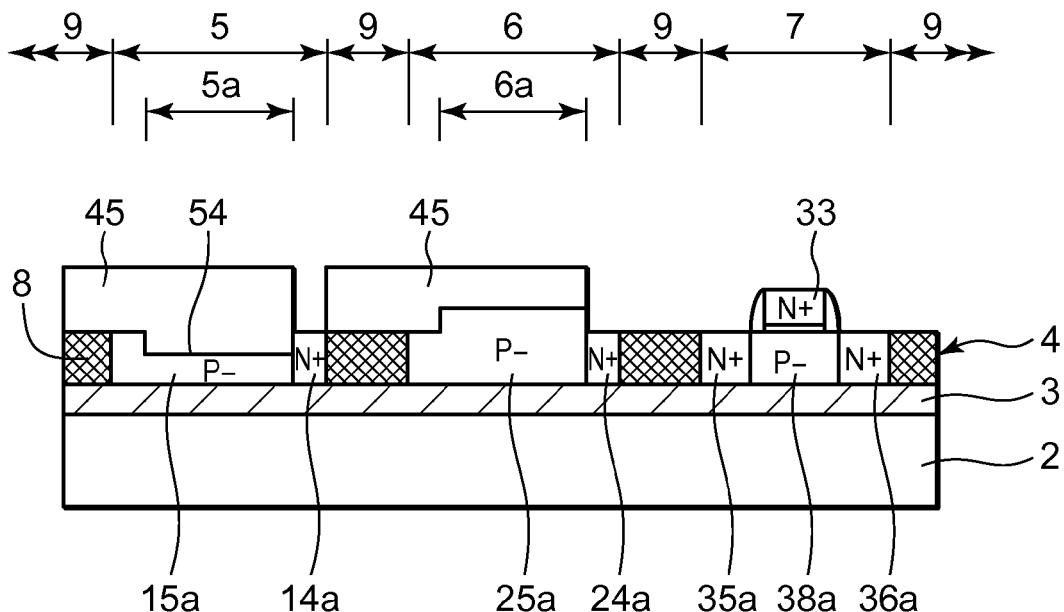
Figure 3H:
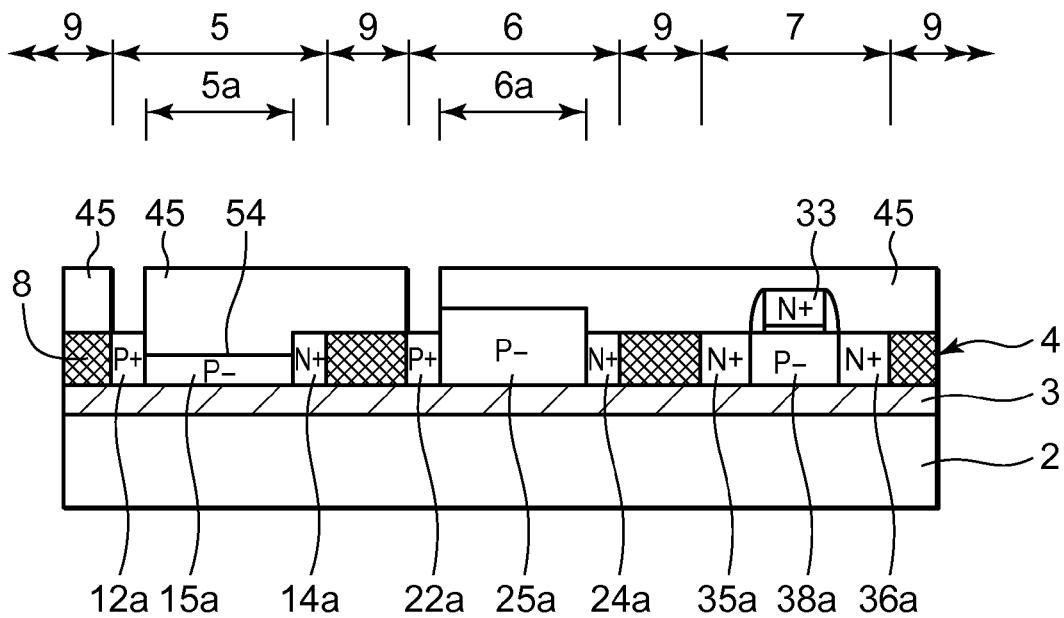
Figure 3I:
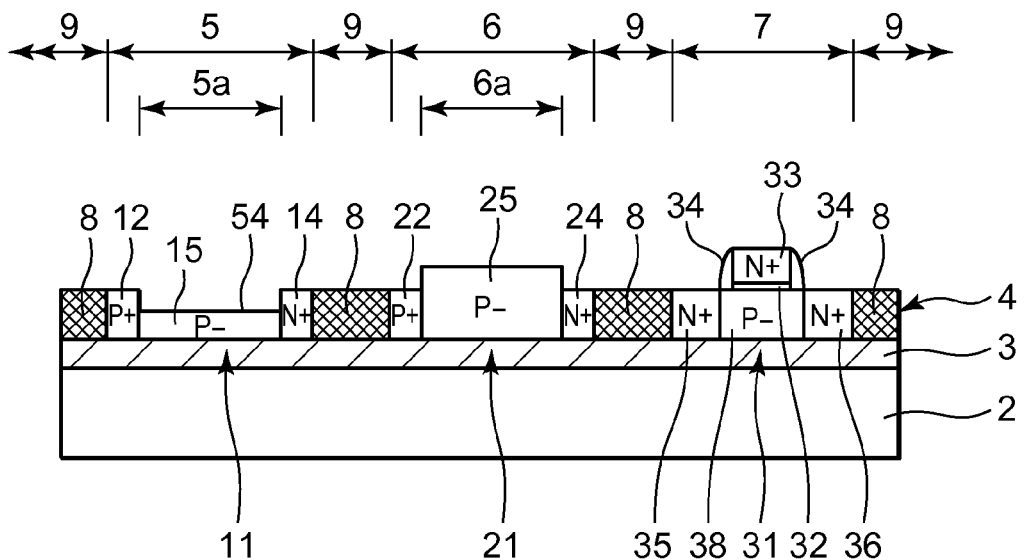
Figure 3J:
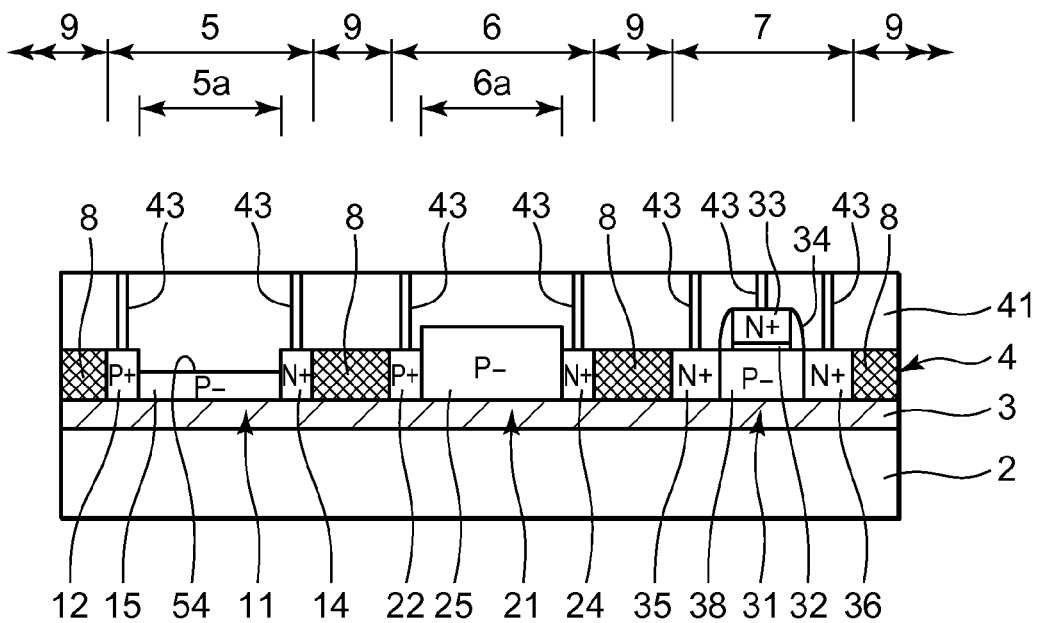
Figure 4:
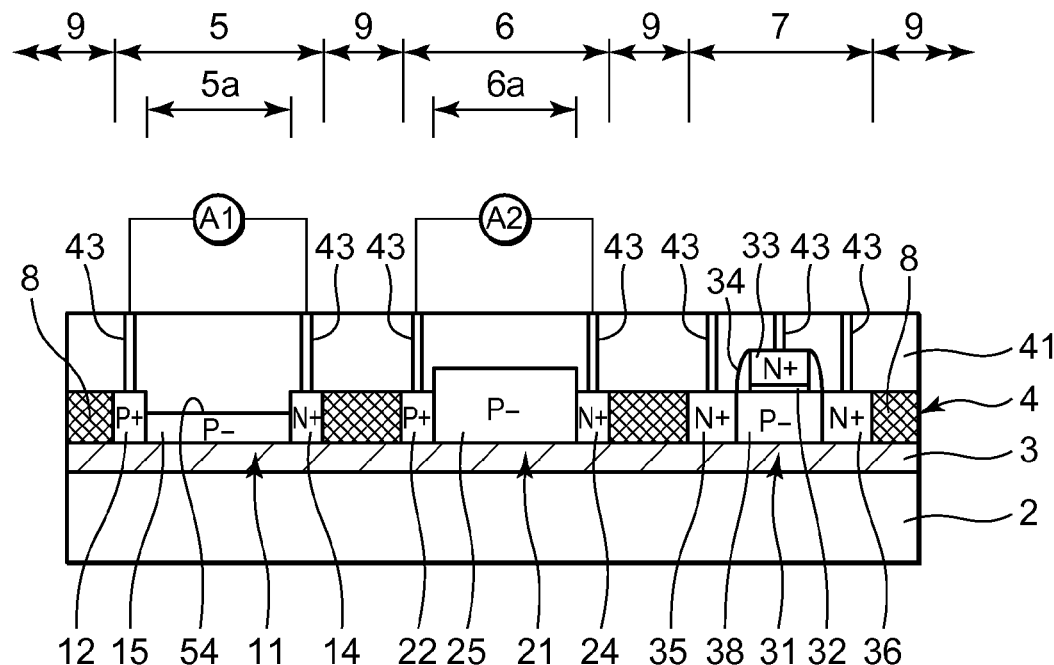
FIG. 4 is an explanatory diagram depicting the operation of the photosensor according to the embodiment.
Figure 5:
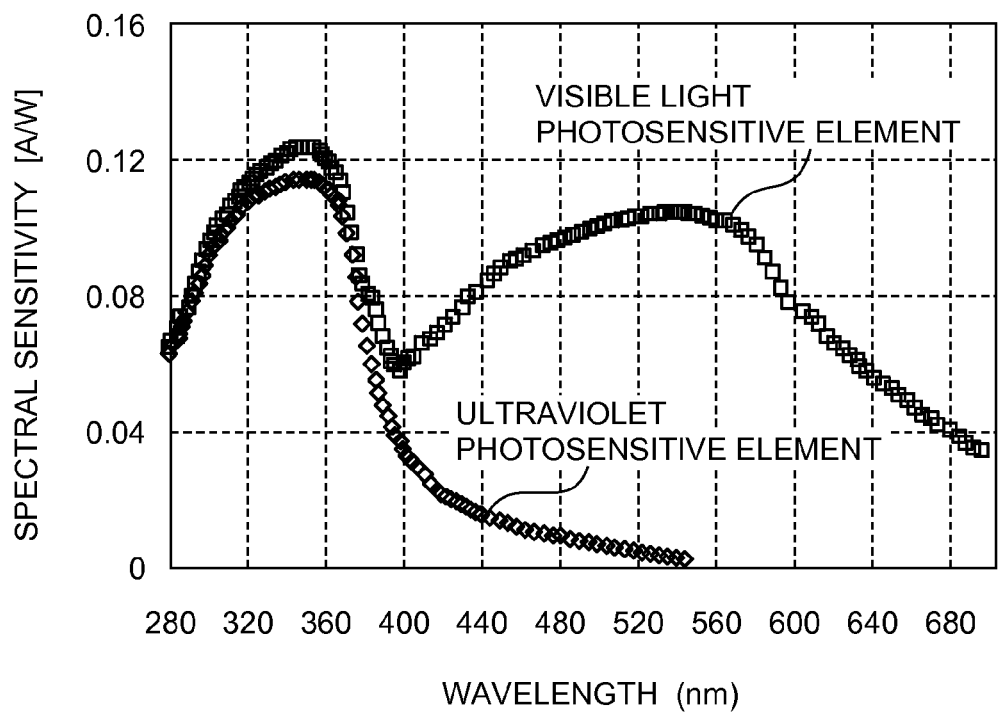
FIG. 5 is a graph showing spectral sensitivity characteristics of an ultraviolet photosensitive element and a visible light photosensitive element according to the embodiment.

FIG. 1 is an explanatory diagram showing a photosensor according to an embodiment, FIG. 2 is an explanatory diagram showing a section of the photosensor according to the embodiment, and FIGS. 3 through 5 are explanatory diagrams showing a method for manufacturing a photo IC equipped with the photosensor according to the embodiment.

Incidentally, FIG. 2 is a sectional view taken along sectional line A-A of FIG. 1.

In FIGS. 1 and 2, reference numeral 1 indicates a photosensor, which includes an ultraviolet photosensitive element 11 and a visible light photosensitive element 21 which are formed in a silicon semiconductor layer 4 of a semiconductor substrate having an SOI structure in which a silicon semiconductor layer 4 comprised of thin monocrystal silicon is formed on a silicon substrate 2 comprised of silicon (Si) with an embedded oxide film 3 used as an insulating layer comprising silicon oxide ($SiO_2$) being interposed therebetween.

As shown in FIG. 3, an ultraviolet element forming area 5 for forming the ultraviolet photosensitive element 11 of the photosensor 1, a visible light element forming area 6 for forming the visible light photosensitive element 21, and a plurality of transistor forming areas 7 for forming nMOS elements 31 and unillustrated pMOS elements each used as a MOSFET (Metal Oxide Semiconductor Field Effect Transistor) that configures a peripheral circuit are set to the silicon semiconductor layer 4 of the present embodiment.

A film-thinning area 5a is set to the ultraviolet element forming area 5 as a region or area for forming a silicon semiconductor layer 4 thinner than the silicon semiconductor layer 4 of each transistor forming area 7. A film-thickening area 6a is set to the visible light forming area 6 as a region or area for forming a silicon semiconductor layer 4 thicker than the silicon semiconductor layer 4 of each transistor forming area 7.

Further, a device or element isolation area 9 for forming a device or element isolation layer 8 is set to the silicon semiconductor layer 4 as an area that surrounds the peripheries of the ultraviolet element forming area 5, the visible light element forming area 6 and the transistor forming areas 7.

The element isolation layer 8 is formed in the silicon semiconductor layer 4 for the element isolation area 9 by an insulating material such as silicon oxide so as to reach the embedded oxide film 3 and has the function of electrically insulating and separating between the ultraviolet element forming area 5, the visible light element forming area 6 and the transistor forming areas 7 adjacent to one another.

Incidentally, the element isolation layer 8 is shown with being hatched for distinction as shown in FIG. 1, FIG. 2 and the like in the present description.

The ultraviolet photosensitive element 11 of the present embodiment is formed in the ultraviolet element forming area 5 set to the silicon semiconductor layer 4.

Reference numeral 12 indicates a first P+ diffusion layer (first diffusion layer) used as a P-type high-concentration diffusion layer, which is of a diffusion layer formed by diffusing a P-type impurity such as boron (B) corresponding to a first conductivity-type impurity of the present embodiment into the silicon semiconductor layer 4 in the ultraviolet element forming area 5 in a relatively high concentration. As shown in FIG. 1, the first P+ diffusion layer 12 is formed of a peak portion that contacts one inner side of the element isolation layer 8, and a plurality of comb-like tooth portions that extend toward the other side opposite to the one side as viewed from the peak portion.

The first P+ diffusion layer 12 of the present embodiment is formed in a "π"-like comb-shaped fashion by causing the two comb-like tooth portions to extend from the peak portion.

Reference numeral 14 indicates a first N+ diffusion layer (second diffusion layer) used as an N-type high-concentration diffusion layer, which is of a diffusion layer formed by diffusing an N-type impurity such as phosphorus (P) or arsenic (As) corresponding to a second conductivity-type impurity of the present embodiment which is a type opposite to the first conductivity-type impurity, into the silicon semiconductor layer 4 in the ultraviolet element forming area 5 in a relatively high concentration. As shown in FIG. 1, the first N+ diffusion layer 14 is formed of a peak portion that contacts the other inner side of the element isolation layer 8, and a plurality of comb-like tooth portions that extend toward one side opposite thereto as viewed from the peak portion.

The first N+ diffusion layer 14 of the present embodiment is formed in an "E"-like comb-shaped fashion by causing the three comb-like tooth portions to extend from both ends of the peak portion and its central portion.

Reference numeral 15 indicates a first P− diffusion layer (third diffusion layer) used as a low-concentration diffusion layer, which is of a diffusion layer formed by diffusing, in a relatively low concentration, a P-type impurity (first conductivity-type impurity) into the silicon semiconductor layer 4 made thin in thickness, which contact the first P+ diffusion layer 12 and the first N+ diffusion layer 14 spaced away from each other and disposed opposite to each other with their comb-like tooth portions being engaged. When light is applied onto a plane-direction depletion layer taken along the upper surface of the silicon semiconductor layer 4 formed herein, the first P− diffusion layer 15 mainly absorbs ultraviolet rays and thereby generates electron-positive hole pairs.

In order to form the silicon semiconductor layer 4 made thin in thickness, an area or region for forming the first P− diffusions layer 15 interposed between the "π"-shaped first P+ diffusion layer 12 and the "E"-shaped first N+ diffusion layer 14 in the ultraviolet element forming area 5 shown in FIG. 1 is set as the film-thinning area 5a.

The visible light photosensitive element 21 of the present embodiment is formed in the corresponding visible light element forming area 6 set to the silicon semiconductor layer 4.

Reference numeral 22 indicates a second P+ diffusion layer (fourth diffusion layer) used as a P-type high concentration diffusion layer, which is of a diffusion layer formed by diffusing a P-type impurity corresponding to a third conductivity-type impurity of the present embodiment into the silicon semiconductor layer 4 in the visible light element forming area 6 in a relatively high concentration. The second P+ diffusion layer 22 is shaped in strip form in contact with one inner side of the element isolation layer 8 as shown in FIG. 1.

Reference numeral 24 indicates a second N+ diffusion layer (fifth diffusion layer) used as an N-type high concentration diffusion layer, which is of a diffusion layer formed by diffusing, in a relatively high concentration, an N-type impurity corresponding to a fourth conductivity-type impurity of the present embodiment, which is a type opposite to the third conductivity-type impurity, into the silicon semiconductor layer 4 in the visible light element forming area 6. The second N+ diffusion layer 24 is shaped in strip form in contact with the other side opposite to the one inner side of the element isolation layer 8.

Reference numeral 25 indicates a second P− diffusion layer (sixth diffusion layer) used as a low concentration diffusion layer, which is of a diffusion layer formed by diffusing, in a relatively low concentration, a P-type impurity (third conductivity-type impurity) into the silicon semiconductor layer 4 made thick in thickness, which contact the second P+ diffusion layer 22 and the second N+ diffusion layer 24 disposed opposite to each other with being spaced away from each other. When light is applied onto a plane-direction depletion layer taken along the upper surface of the silicon semiconductor layer 4 formed herein, the second P− diffusion layer 25 mainly absorbs ultraviolet rays and visible light and thereby generates electron-positive hole pairs.

In order to form the silicon semiconductor layer 4 made thick in thickness, an area or region for forming the rectangular second P− diffusions layer 25 interposed between the second P+ diffusion layer 22 and the second N+ diffusion layer 24 shown in FIG. 1 is set as the film-thickening area 6a.

Incidentally, although the first P− diffusion layer 15 and the second P− diffusion layer 25 in the present embodiment are respectively lower in impurity concentration than the first P+ diffusion layer 12 and the second P+ diffusion layer 22, they are formed in different concentrations.

The ultraviolet photosensitive element 11 and the visible light photosensitive element 21 according to the present embodiment are formed together with the nMOS element 31 and the unillustrated pMOS element or the like that configure the peripheral circuit for controlling the ultraviolet photosensitive element 11 and the visible light photosensitive element 21 as shown in FIG. 5 (P9), and the corresponding photo IC equipped with the photosensor 1 is formed.

The nMOS element 31 of the present embodiment is formed in its corresponding transistor forming area 7 set to the silicon semiconductor layer 4.

In FIG. 3I, reference numeral 32 indicates a gate oxide film, which is an insulating film comprised of an insulating material such as silicon oxide and relatively thin in thickness.

Reference numeral 33 indicates a gate electrode, which is of an electrode comprised of polysilicon or the like, in which an impurity (N type corresponding to the second conductivity-type impurity in the present embodiment) of the same type as a source layer 35 (to be described later) is diffused in a relatively high concentration. The gate electrode 33 is formed opposite to the silicon semiconductor layer 4 of the transistor forming area 7 at the central part as viewed in a gate-length direction, of the transistor forming area 7 with the gate oxide film 32 interposed therebetween. Sidewalls 34 each comprised of an insulating material such as silicon nitride ($Si_3N_4$) are formed at side faces of the gate electrode 33.

A source layer 35 and a drain layer 36 in which an N-type impurity is diffused in a relatively high concentration, are formed in the silicon semiconductor layer 4 on both sides of the gate electrode 33 in the transistor forming area 7.

The P-type silicon semiconductor layer 4 lying in the midst of the silicon semiconductor layer 4 in which the P-type impurity located below the gate oxide film 32 is diffused in a relatively low concentration, functions as a channel region 38 in which a channel for the nMOS element 31 of the present embodiment is formed.

Incidentally, the pMOS element is similarly formed in another transistor forming area 7 set to the silicon semiconductor layer 4 with the conductivity type of the impurity of the nMOS element 31 being set in reverse.

The gate-length direction indicates a direction extending from the source layer 35 to the drain layer 36 in parallel with the upper surface of the silicon semiconductor layer 4 or its reverse direction.

In FIG. 3J, reference numeral 41 indicates an interlayer insulating film, which is of an insulating film relatively thick in thickness, comprised of an insulating material having a light-transmissive property, such as NSG (Nondoped Silica Glass) or silicon oxide that covers the ultraviolet photosensitive element 11, the visible light photosensitive element 21, the nMOS element 31 and the like formed on the silicon semiconductor layer 4.

Reference numerals 43 indicate contact plugs, which are of conductive plugs formed by embedding a conductive material such as tungsten (W) or aluminium (Al) into contact holes opened as through holes that extend through the interlayer insulating film 41 and reach the source layer 35 and drain layer 36 of the nMOS element 31, the first P+ diffusion layer 12 and first N+ diffusion layer 14 of the ultraviolet photosensitive element 11, the second P+ diffusion layer 22 and second N+ diffusion layer 24 of the visible light photosensitive element 21. The contact plugs 43 are electrically connected to unillustrated wirings formed on the interlayer insulating film 41 by means of a conductive material similar to the contact plugs 43.

In FIG. 3, reference numeral 45 indicates a resist mask used as a mask member, which is a mask pattern formed by performing exposure and development processing on a positive or negative resist applied onto the silicon semiconductor layer 4 by photolithography. The resist mask 45 functions as a mask for etching and ion implantation according to the present embodiment.

The thickness of the silicon semiconductor layer 4 thin in thickness in the film-thinning area 5a in the present embodiment is formed to a thickness that ranges from 3 nm or more to 36 nm or less, which has been proposed in Japanese Patent Application No. 2007-311089 or the like by the applicant (30 nm in the present embodiment).

This is because if the thickness of the silicon semiconductor layer 4 is set to such a thickness, then the corresponding ultraviolet photosensitive element 11 having peak sensitivity contained in a waveform lying in an ultraviolet region can be formed.

The thickness of the silicon semiconductor layer 4 thick in thickness in the film-thickening area 6a according to the present embodiment is formed to a thickness of 150 nm or more (1000 nm in the present embodiment).

This is because if the thickness of the silicon semiconductor layer 4 is set to such a thickness, then the corresponding visible light photosensitive element 21 having peak sensitivity contained in a wavelength of 450 nm or more can be formed.

Further, the thickness of the silicon semiconductor layer 4 is formed to a thickness (50 nm in the present embodiment) ranging from 40 nm or more to 100 nm or less to ensure the operation of each MOSFET such as the nMOS element 31.

A method for manufacturing the photo CI equipped with the photosensor according to the present embodiment will be explained below in accordance with processes indicated P in FIG. 3.

A semiconductor substrate employed in the present embodiment is of a substrate obtained by forming, by a thermal oxidation method, a sacrifice oxide film in a silicon layer of a semiconductor substrate of an SOI structure formed with the silicon layer being left on the embedded oxide film 3, or a semiconductor substrate of an SOI structure in which a silicon layer is laminated on the embedded oxide film 3 and eliminating it by wet etching thereby to form the thickness of the silicon semiconductor layer 4 to 1000 nm.

As shown in FIG. 3A, a semiconductor substrate in which a silicon semiconductor layer 4 whose thickness is set to 1000 nm is formed on its corresponding embedded oxide film 3 formed on the silicon semiconductor layer 4, is prepared. A silicon nitride film 51 comprised of silicon nitride is formed on the silicon semiconductor layer 4 by a CVD (Chemical Vapor Deposition) method. A resist mask 45 (not shown) that covers the film-thickening area 6a in the visible light element forming area 6 is formed on the silicon nitride film 51 by photolithography. With the resist mask 45 as a mask, the silicon nitride film 51 is etched by anisotropic etching to expose the silicon semiconductor layer 4 except for the film-thickening area 6a.

The resist mask 45 is eliminated and a sacrifice oxide film is formed in the silicon semiconductor layer 4 excluding the film-thickening area 6a by the thermal oxidation method with the exposed silicon nitride film 51 as an oxidation-resistant mask. The sacrifice oxide film is removed by wet etching thereby to form the corresponding silicon semiconductor layer 4 in which the thickness of the film-thickening area 6a is set to 1000 nm and the thickness of other area is set to 50 nm.

Thus, a second P− diffusion layer 25 film-thickened to a predetermined thickness (1000 nm in the present embodiment) can be formed.

As shown in FIG. 3B, the silicon nitride film 51 is removed by wet etching based on thermal phosphoric acid to form a pad oxide film having a thin thickness over the entire surface of the silicon semiconductor layer 4 by the thermal oxidation method. A silicon nitride film comprises of silicon nitride is formed on the pad oxide film by the CVD method. A resist mask 45 (not shown) that has exposed the element isolation area 9 is formed on the silicon nitride film by photolithography. With the resist mask 45 as a mask, the silicon nitride film is removed by anisotropic etching to expose the pad oxide film.

The resist mask 45 is eliminated and the silicon semiconductor layer 4 of the element isolation area 9 is oxidized by a LOCOS (Local Oxidation Of Silicon) method to form an element isolation layer 8 that reaches the embedded oxide film 3. The silicon nitride film and the pad oxide film are removed by wet etching thereby to form the corresponding element isolation layer 8 in the element isolation area 9 of the silicon semiconductor layer 4.

A resist mask 45 that has exposed the ultraviolet element forming area 5 and the transistor forming area 7 in the silicon semiconductor layer 4, i.e., that covers the visible light element forming area 6 and the corresponding transistor forming area 7 for forming the unillustrated pMOS element is formed on the silicon semiconductor layer 4 by photolithography. There are formed P-type low concentration implantation layers 15a and 38a obtained by, with the resist mask 45 as a mask, implanting P-type impurity ions into the silicon semiconductor layers 4 in the exposed ultraviolet element forming area 5 and transistor forming area 7 and implanting a P-type impurity into the silicon semiconductor layers 4 in a relatively low concentration.

As shown in FIG. 3C, the resist mask 45 is eliminated and a resist mask 45 having exposed the visible light element forming area 6 is formed on the corresponding silicon semiconductor layer 4 by photolithography. There is formed a P-type low concentration implantation layer 25a obtained by, with the resist mask as a mask, implanting P-type impurity ions into the corresponding exposed silicon semiconductor layer 4 of the visible light element forming area 6 and implanting a P-type impurity into the corresponding silicon semiconductor layer 4 of the visible light element forming area 6 in a low concentration in a concentration different from that of each of the P-type low concentration implantation layers 15a and 38a.

As shown in FIG. 3D, the resist mask 45 formed in the process P3 is removed and the upper surface of the silicon semiconductor layer 4 is oxidized by the thermal oxidation method to form a silicon oxide film comprised of silicon oxide. Polysilicon is deposited on the silicon oxide film by the CVD method to form a relatively thick polysilicon layer. A resist mask 45 (not shown) that covers a region for forming a gate electrode 33 at a central portion in a gate-length direction, of the corresponding transistor forming area 7 is formed on the polysilicon layer by photolithography. The polysilicon layer and the silicon oxide film are etched by anisotropic etching with the resist mask as a mask to expose the corresponding silicon semiconductor layer 4, thereby forming the corresponding gate electrode 33 opposite to the silicon semiconductor layer 4 via the gate oxide film 32, followed by removal of the resist mask 45.

As shown in FIG. 3E, silicon nitride is deposited over the entire surface of the silicon semiconductor layer 4 such as the gate electrode 33 by the CVD method to form a silicon nitride film. The silicon nitride film is etched by anisotropic etching to expose the upper surface of the gate electrode 33 and the upper surface of the silicon semiconductor layer 4, followed by formation of sidewalls 34 on the side faces of the gate electrode 33.

As shown in FIG. 3F, a resist mask 45 hang an opening 53 having exposed the silicon semiconductor layer 4 in the film-thickening area 5a of the ultraviolet element forming area 5 is formed by photolithography. With the resist mask 45 as a mask, the exposed silicon semiconductor layer 4 is etched by anisotropic etching to form a concave or recess portion 54 for thinning the thickness of the silicon semiconductor layer 4 to a predetermined thickness (30 nm in the present embodiment) set to the film-thickening area 5a, thereby thinning the thickness of a first P− diffusion layer 15 to a predetermined thickness.

As shown in FIG. 3G, the resist mask 45 formed in the process P6 is removed. A resist mask 45 that has exposed a forming region ("E"-shaped portion shown in FIG. 1) of a first N+ diffusion layer 14 of the ultraviolet element forming area 5, a forming region of a second N+ diffusion region 24 of the visible light element forming area 6 and the silicon semiconductor layer 4 of the corresponding transistor forming area 7 is formed by photolithography. There are formed N-type high concentration implantation layers 14a, 24a, 35a and 36a obtained by, with the resist mask 45 as a mask, implanting N-type impurity ions into the silicon semiconductor layer 4 and polysilicon of the gate electrode 33, implanting an N-type impurity into the gate electrode 33 in a high concentration, and implanting, in a high concentration, an N-type impurity into the silicon semiconductor layer 4 corresponding to each of regions for forming source and drain layers 35 and 36 on both sides of the sidewalls 34 and the silicon semiconductor layer 4 corresponding to each of the regions for forming the first and second N+ diffusion layers 14 and 24.

As shown in FIG. 3H, the resist mask 45 formed in the process P7 is removed and a resist mask 45 having exposed the silicon semiconductor layer 4 corresponding to each of a forming region ("π"-shaped portion shown in FIG. 1) of a first P+ diffusion layer 12 of the ultraviolet element forming area 5 and a forming region of a second P+ diffusion layer 22 of the visible light element forming area 6 is formed by photolithography. There are formed P-type high concentration implantation layers 12a and 22a obtained by, with the resist mask 45 as a mask, implanting P-type impurity ions into the silicon semiconductor layer 4 and implanting a P-type impurity into the silicon semiconductor layer 4 corresponding to each of the forming regions for the first and second P+ diffusion layers 12 and 22 in a high concentration.

As shown in FIG. 3I, the resist mask 45 formed in the process P8 is eliminated. The impurities implanted into the respective implantation layers are activated by heat treatment at a high temperature (700° C. or higher in the present embodiment) to diffuse a predetermined type impurity into the respective diffusion layers in a predetermined concentration, thereby forming the corresponding first P+ diffusion layer 12, first N+ diffusion layer 14 and first P− diffusion layer 15 of the ultraviolet photosensitive element 11 in the ultraviolet element forming area 5, forming the corresponding second P+ diffusion layer 22, second N+ diffusion layer 24 and second P− diffusion layer 25 of the visible light photosensitive element 21 in the visible light element forming area 6, and forming the corresponding source layer 35, drain layer 36 and channel region 38 of the nMOS element 31 in the transistor forming area 7.

As shown in FIG. 3J, NSG is deposited relatively thick over the entire surface of the silicon semiconductor layer 4 by the CVD method after heat treatment. Its upper surface is subjected to a flattening process to form an interlayer insulating film 41. A resist mask 45 (not shown) having openings having exposed the interlayer insulating film 41 corresponding to each of forming regions of contact plugs 43 respectively lying on the first P+ diffusion layer 12 and first N+ diffusion layer 14 of the ultraviolet photosensitive element 11, the second P+ diffusion layer 22 and second N+ diffusion layer 24 of the visible light photosensitive element 21, and the source layer 35 and drain layer 36 of the nMOS element 31 is formed on the interlayer insulating film 41 by photolithography. Contact holes that extend through the interlayer insulating film 41 and reach the respective diffusion layers are formed by anisotropic etching for selectively etching NSG with the resist mask 45 as a mask. After the removal of the resist mask, a conductive material is embedded into the contact holes by the CVD method or sputter method to form the corresponding contact plugs 43. Their upper surfaces are subjected to a flattening process to expose the upper surface of the interlayer insulating film 41.

Thereafter, a wiring layer comprised of a conductive material is formed on the interlayer insulating layer 41 by the CVD method or sputter method. A resist mask 45 (not shown) that covers wiring forming regions is formed on the wiring layer by photolithography. With the resist mask 45 as a mask, the wiring layer is etched to expose the interlayer insulating film 41. The resist mask 45 is eliminated and unillustrated wirings electrically connected to the respective contact plugs 43 are formed.

One-chipped photosensor 1 equipped with the ultraviolet photosensitive element 11 and the visible light photosensitive element 21 employed in the present embodiment is formed in this way. The photo IC equipped with the nMOS element 31 or the like that constitutes the peripheral circuit for controlling these is formed.

When the voltage is applied between the first P+ diffusion layer 12 and first N+ diffusion layer 14 of the ultraviolet photosensitive element 11 as shown in FIG. 6 where the intensity of light in the ultraviolet region and the intensity of light in the visible light region are detected using the photosensor 1, a depletion layer is formed in the thin first P− diffusion layer 15. When light transmitted through the interlayer insulting film 41 formed of the insulating material such as NSG having the light-transmissive property is applied onto the depletion layer, the visible light region is cut by the thickness of the first P− diffusion layer 15, so that the light in the ultraviolet region is absorbed to produce or generate electron-positive hole pairs. The electron-positive hole pairs are pulled out as a current Al from the first P+ diffusion layer 12. According to a simulation where light lying in a wavelength region ranging from 300 nm to 700 nm is applied, as shown in FIG. 7, a spectral sensitivity characteristic with a wavelength 350 nm as a peak is obtained and hence the intensity of light in the ultraviolet region is detected.

When the voltage is applied between the second P+ diffusion layer 22 and second N+ diffusion layer 24 of the visible light photosensitive element 21, a depletion layer is formed in the thick second P− diffusion layer 25. When light transmitted through the interlayer insulating film 41 is applied to the depletion layer, ultraviolet light and light in the visible light region are absorbed to generate electron-positive hole pairs. The electron-positive hole pairs are pulled out as a current A2 from the second P+ diffusion layer 22. According to a simulation where light lying in a wavelength region ranging from 300 nm to 700 nm is applied, a spectral sensitivity characteristic with a wavelength 350 nm and a wavelength 550 nm as peaks is obtained as shown in FIG. 7.

When the current A1 of the ultraviolet photosensitive element 11 is multiplied by a predetermined coefficient and the so-processed current is subtracted from the current A2 of the visible light photosensitive element 21, a spectral sensitivity characteristic having sensitivity at a wavelength ranging from 400 nm to 700 nm is obtained and hence the intensity of light in the visible light region is detected.

The predetermined coefficient is set in such a manner that spectral sensitivity having an ultraviolet region of 400 nm or less at the current A2 is canceled out by subtraction using the current A1.

The arithmetic operation, the voltage application and the like are performed by the peripheral circuit comprised of the nMOS element 31 or the like formed in the silicon semiconductor layer 4.

Thus, since the photosensor 1 of the present embodiment is one-chipped in a state in which the ultraviolet photosensitive element 11 having the first P− diffusion layer 15 thinner than the silicon semiconductor layer 4 in thickness, and the visible light photosensitive element 21 having the second P− diffusion layer 25 thicker than the silicon semiconductor layer 4 in thickness are formed in the silicon semiconductor layer 4 of the semiconductor substrate having the SOI structure, and it has the function of detecting the ultraviolet light and the function of detecting the visible light, miniaturization of an apparatus equipped with the photosensor 1 can be easily attained.

Since one chipping is enabled inclusive of the peripheral circuit comprised of the nMOS element 31 or the like formed in the silicon semiconductor layer 4, the photo IC equipped with the photosensor 1 can be easily formed and hence the miniaturization of the apparatus equipped with the photosensor 1 can be further promoted. Further, in the present embodiment, the predetermined impurity is implanted into the silicon semiconductor layer 4 in each of the ultraviolet element forming area 5 and the visible light element forming area 6 after the film-thickening process P1 requiring the high-temperature heat treatment and the formation of the element isolation layer 8 and the gate insulating film 42 or the like. Thereafter, the impurities lying in the respective implantation layers are activated by once-heat treatment to form the diffusion layers. Impurity profiles for the respective implantation layers can be easily controlled without the respective implantation layers being affected by heat treatment in the course of the process.

Further, since the first P+ diffusion layer 12 and first N+ diffusion layer 14 of the ultraviolet photosensitive element 11, and the second P+ diffusion layer 22 and second N+ diffusion layer 24 of the visible light photosensitive element 21 employed in the present embodiment are formed in the silicon semiconductor layer 4 having the same thickness as the silicon semiconductor layer 4 for forming the source layer 35 and drain layer 36 of the nMOS element 31, the depths of the contact holes that reach the first and second P+ diffusion layers 12 and 22 and the first and second N+ diffusion layers 14 and 24 can be made identical to those of the contact holes that reach the diffusion layers for the source layer 35 and the like of the nMOS element 31. Further, the process of forming the contact plugs can be simplified as compared with the case in which the thickness of the silicon semiconductor layer 4 for forming the nMOS element 31 or the like is set to another thickness, thereby making it possible to attain the simplification of the manufacturing process of the photosensor 1.

Furthermore, the photosensor 1 of the present embodiment detects the intensity of light in the ultraviolet region by the ultraviolet photosensitive element 11 and detects the intensity of light in the visible light region by the arithmetic operation using the output from the visible light photosensitive element 21 having the peak sensitivity in the ultraviolet region and the visible light region and the output from the ultraviolet photosensitive element 11. Therefore, if the two photosensitive elements are formed in the photosensor 1, the photosensor 1 equipped with the ultraviolet-light detecting function and the visible-light detecting function can be formed, thereby making it possible to contribute to miniaturization of an apparatus equipped with the photosensor.

In the present embodiment as described above, the ultraviolet photosensitive element having the first P− diffusion layer made thinner than the silicon semiconductor layer and the visible light photosensitive element having the second P− diffusion layer made thicker than the silicon semiconductor layer are formed in the silicon semiconductor layer lying on the embedded oxide film formed on the silicon substrate. Thus, the photosensor in which the ultraviolet photosensitive element and the visible light photosensitive element are formed in the silicon semiconductor layer of the same semiconductor substrate and which includes the ultraviolet-light detecting function and the visible-light detecting function, can be reduced in size by being one-chipped, thereby making it possible to facilitate miniaturization of an apparatus equipped with the photosensor.

Incidentally, although the above embodiment has explained the case in which the impurity concentrations of the first P− diffusion layer and the second P− diffusion layer are formed to the different concentrations, the first P− diffusion layer and the second P− diffusion layer may be formed to the same impurity concentration. If done in this way, it is then possible to simplify the process of forming the P-type low concentration implantation layers and attain the simplification of the manufacturing process of the photosensor.

Although the above embodiment has described that the thickened silicon semiconductor layer for eliminating the sacrifice oxide film by wet etching thereby to form the second P− diffusion layer is formed in the process P1, the silicon semiconductor layer in the region excluding the film-thickening region may be etched by anisotropic etching to form the silicon semiconductor layer in each of the ultraviolet element forming area and the transistor forming area to a predetermined thickness.

Further, although the above embodiment has described that the thickness of the second P− diffusion layer thick in thickness is 1000 nm, the thickness thereof may be thinner or thicker than 1000 nm. In brief, if such a thickness that each of the ultraviolet region and the visible light region has peak sensitivity is adopted, then the thickness thereof may be suitably set depending on a wavelength region to be absorbed.

In this case, if the thickness of the second P− diffusion layer is set to such a thickness as to be capable of passing a wavelength in an infrared region and cutting it, e.g., a thickness ranging from about 150 nm to 200 nm, the intensity of light in the visible light region can be detected more accurately without being affected by the infrared light or rays.

Furthermore, although the above embodiment has described that the thicknesses of the second P+ diffusion layer and second N+ diffusion layer of the visible light photosensitive element is formed to the same thickness as the thickness of the silicon semiconductor layer of the corresponding transistor forming area for forming the nMOS element or the like, their thicknesses may be formed to the same thickness as the thickened second P− diffusion layer.

Still further, although the above embodiment has described that each of the second P+ diffusion layer and second N+ diffusion layer of the visible light photosensitive element is formed in a strip fashion, it may be formed in "π"-shaped and "E"-shaped fashions in a manner similar to the ultraviolet photosensitive element.

Still further, although the first P+ diffusion layer of the ultraviolet photosensitive element is formed in the "π"-shaped fashion and the first N+ diffusion layer thereof is formed in the "E"-shaped fashion, their shapes may be reversed and the number of the comb-like tooth portions may be further increased.

Still further, although the above embodiment has described that the P− diffusion layers of the ultraviolet photosensitive element and the visible light photosensitive element are formed by diffusing the P-type impurity, an advantageous effect similar to the above can be obtained even if the P− diffusion layers may be formed by diffusing an N-type impurity in a relatively low concentration.

Still further, although the above embodiment has described that the first conductivity-type impurity and the third conductivity-type impurity diffused into the respective diffusion layers are used as the P-type impurity and the second conductivity-type impurity and the fourth conductivity-type impurity diffused therein are used as the N-type impurity, an advantageous effect similar to the above can be obtained even if they are used in reverse, i.e., the N-type impurity is used as the first conductivity-type impurity and the third conductivity-type impurity, and the P-type impurity is used as the second conductivity-type and the fourth conductivity-type impurity.

Still further, although the above embodiment has described that the first conductivity-type impurity and the third conductivity-type impurity are set to the same conductivity type, they may be set to different conductivity types.

Still further, although the above embodiment has described that the silicon semiconductor layer is of the silicon semiconductor layer formed on the embedded oxide film used as the insulating layer of the semiconductor substrate having the SOI structure, the present silicon semiconductor layer may be a silicon semiconductor layer of a semiconductor substrate having an SOS (Silicon On Sapphire) structure formed on a sapphire substrate used as an insulating layer, a silicon semiconductor layer of a semiconductor substrate having an SOQ (Silicon On Quartz) structure formed on a quartz substrate used as an insulting layer, or the like.

While the preferred forms of the present invention have been described, it is to be understood that modifications will be apparent to those skilled in the art without departing from the spirit of the invention. The scope of the invention is to be determined solely by the following claims.

What is claimed is:
1. A photosensor comprising:
a silicon substrate;
an insulating layer formed over the silicon substrate;
an ultraviolet photosensitive element formed over the insulating layer and having a first diffusion layer having a first conductivity type, a second diffusion layer provided spaced away from the first diffusion layer and having a second conductivity type opposite to the first conductivity type, and a third diffusion layer connected with the first diffusion layer and the second diffusion layer respectively and having the first conductivity type; and a visible light photosensitive element formed over the insulating layer with being spaced away from the ultraviolet photosensitive element, said visible light photosensitive element having a fourth diffusion layer having a third conductivity type, a fifth diffusion layer provided spaced away from the fourth diffusion layer and having a fourth conductivity type opposite to the third conductivity type, and a sixth diffusion layer connected with the fourth diffusion layer and the fifth diffusion layer respectively and having the third conductivity type, wherein the thickness of the third diffusion layer of the ultraviolet photosensitive element is smaller than that of the sixth diffusion layer of the visible light photosensitive element.

2. The photosensor according to claim 1, wherein the thickness of the third diffusion layer of the ultraviolet photosensitive element is smaller than the thicknesses of the first and second diffusion layers of the ultraviolet photosensitive element.

3. The photosensor according to claim 1, wherein thickness of the sixth diffusion layer of the visible light photosensitive element is larger than the thicknesses of the fourth and fifth diffusion layers of the visible light photosensitive element.

4. The photosensor according to claim 1, further including an element isolation layer which is formed over the insulating layer and surrounds the ultraviolet photosensitive element and the visible light photosensitive element.

5. The photosensor according to claim 1, wherein an impurity concentration of the third diffusion layer of the ultraviolet photosensitive element and an impurity concentration of the sixth diffusion layer of the visible light photosensitive element are different from each other.

6. The photosensor according to claim 1, wherein the first conductivity type and the third conductivity type are different conductivity types.

7. The photosensor according to claim 1, wherein the first conductivity type and the third conductivity type are of the same conductivity type.

8. A photo IC equipped with the photosensor according to claim 1, wherein a peripheral circuit for controlling the ultraviolet photosensitive element and the visible light photosensitive element is formed over the insulating layer.

* * * * *